United States Patent
Freund et al.

[19]

[11] Patent Number: 6,088,212
[45] Date of Patent: *Jul. 11, 2000

[54] APPARATUS AND METHOD FOR MINIMIZING ELECTROSTATIC DISCHARGE DAMAGE TO SEMICONDUCTOR OBJECTS

[75] Inventors: Joseph Michael Freund, Fogelsville; Raymond Frank Gruszka, Reading; George John Przybylek, Douglasville; Dennis Mark Romero, Allentown; Nancy Louise Reyes, Coopersburg, all of Pa.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 09/135,368

[22] Filed: Aug. 17, 1998

[51] Int. Cl.⁷ .................................................. H05F 1/00
[52] U.S. Cl. .......................... 361/212; 361/229; 206/720
[58] Field of Search .................................. 361/212, 213, 361/220, 225, 229; 206/719, 720, 524.1, 524.6; 383/101, 103

[56] References Cited

U.S. PATENT DOCUMENTS

| 3,562,058 | 2/1971 | Boyd . |
| 4,203,127 | 5/1980 | Tegge, Jr. . |
| 5,899,730 | 5/1999 | Freund et al. .......................... 438/464 |

*Primary Examiner*—Jeffrey Gaffin
*Assistant Examiner*—Kim Huynh
*Attorney, Agent, or Firm*—Gibbons, Del Deo, Dolan, Griffinger & Vecchione

[57] ABSTRACT

An apparatus and method for minimizing electrostatic discharge damage to semiconductor objects utilizes an ionized air stream to reduce electrostatic and triboelectric potential build up in and surrounding semiconductor storage containers. The ionized air stream is continuously directed to a designated area where stored semiconductor objects are being removed from. Electrostatic and triboelectric potential is greatly reduced, minimizing the threat of electrostatic discharge and damage.

2 Claims, 4 Drawing Sheets

6,088,212

APPARATUS AND METHOD FOR MINIMIZING ELECTROSTATIC DISCHARGE DAMAGE TO SEMICONDUCTOR OBJECTS

FIELD OF THE INVENTION

This invention relates generally to the storage of semiconductor objects and specifically to minimizing the damage caused by electrostatic discharge (ESD) while semiconductor objects are removed from storage.

BACKGROUND OF THE INVENTION

Typically semiconductor objects, such as wafers, chips, die, pieces and bars, are stored in storage containers after processing and before implementation into an electronic or computer device. Various types of storage containers exist to protect these semiconductor objects from particulate and handling damage. The problems with the prior art containers occur, however, when attempting to remove the semiconductor objects from the container. Due to the small size and delicate nature of semiconductor objects, electrostatic potential that builds within and around the storage container can cause serious damage to the semiconductor objects upon discharge. There are typically two sources of electrostatic potential: 1) electrostatic transfer from a person or mechanism that removes the semiconductor objects from the storage container and 2) triboelectric discharges that may be present when peeling apart the sheets forming the storage container. Thus, not only are careful storage procedures required, but semiconductor objects must be carefully removed from storage containers.

Semiconductor objects are typically enclosed in a protective envelope to prevent electrostatic discharge damage. The amount of protection a particular protective envelope affords depends greatly on the type of material being used for the envelope. Protective envelopes, however, have presented numerous problems and have been found to be unsatisfactory in reducing the electrostatic discharge damage done to semiconductor objects.

A typical prior art protective envelope is made from a transparent sheet material composed of an electrically non-conductive polymeric sheet. The surface of the envelope is made conductive by applying a special treatment on the polymeric sheet, applying a coating of antistatic material on both surfaces of the polymeric sheet, or disposing antistatic material throughout the polymeric sheet such that the volume conductivity of the polymeric sheet is not significantly increased. The resistivity on the surfaces of the envelope, however, does not permit the envelope to assume the electrostatic potential of a person or mechanism opening the envelope before the semiconductor object is removed. This results in a damaging electrostatic charge being transferred from the person or mechanism to the semiconductor object after the envelope is opened. Since the charges on the person or the mechanism handling the envelope are not rapidly dissipated by the outer surface, they are capacitively coupled through the envelope and cause serious damage to the semiconductor objects therein.

Other types of sheet materials that are used for protective envelopes include high volume conductive carbon loaded polymeric sheets or metal foils. While these protective envelopes are comparatively effective in the dissipation of electrostatic charges, a disadvantage is that they are opaque and do not afford visual identification of the semiconductor objects being stored therein. A further drawback is that contact between the semiconductor object and the inner surface of the envelope causes metal or carbon filled scrapings to contaminate the semiconductor objects. Disadvantageously, such volume conductive sheet materials conduct electrostatic charges directly to the semiconductor object within the envelope. That is, the inner surface of the plastic bag does not dissipate the charges on the semiconductor object caused during processing and storage and the triboelectric charges caused by the relative movement between the objects and the inner surface of the polymeric bag.

Another method of minimizing ESD damage is to flood the work area surrounding the object with ionized air while removing the semiconductor object from the storage container. Although the risk of electrostatic charge transfer between the person or mechanism removing the semiconductor objects may be reduced, this method is ineffective in dissipating the triboelectric charge generated between the insulating surfaces, where the semiconductor objects are stored, when the surfaces are peeled apart.

SUMMARY OF THE INVENTION

The invention is an apparatus and method for minimizing electrostatic discharge damage to semiconductor objects by directly blowing ionized air between the surfaces where the semiconductor objects are being stored to effectively eliminate triboelectric charges. The invention does not require that a particular material be used for the storage carrier or protective envelope as required in the prior art devices. The invention is versatile and compatible with a number of storage containers and protective envelopes.

An exemplary embodiment of the invention uses a first and second insulating film, a mounting structure having ports and an ionized air stream. The ionized air stream being directed at the semiconductor object greatly reduces the presence of electrostatic charge around the semiconductor objects, thereby reducing damage from electrostatic discharge. Specifically, by introducing ionized air between the surfaces where semiconductor objects are mounted before the surfaces are separated, triboelectric charge generated by separation and removal of the sheets is substantially eliminated. The invention, therefore, overcomes numerous disadvantages of the prior art.

BRIEF DESCRIPTION OF THE DRAWINGS

For a detailed understanding of the present invention, reference should be made to the following detailed description taken in conjunction with the accompanying drawings wherein.

DETAILED DESCRIPTION

The invention is an apparatus and method for minimizing electrostatic discharge damage to semiconductor objects when they are removed from a storage container. A stream of directed ionized air is used to reduce electrostatic charge between the two surfaces storing the semiconductor objects. Typically, semiconductor objects are stored in storage containers or protective envelopes after they have been processed, but before they are implemented into an electronic or computer device. Although the description of the device is given where the structural embodiment of the storage container is a mounting structure using two insulating films, the invention can be used with a variety of other storage carriers, such as protective envelopes. Moreover, the invention works with any kind of insulating film.

While in storage, electrostatic potential grows within and in the area surrounding the storage containers. When one of the insulating sheets of a storage container is peeled back to remove a semiconductor object, a high triboelectric charge develops. These triboelectric charges, when discharged, cause an ESD failure in the stored semiconductor objects, rendering the objects useless. These failures can be latent and undetected during downstream performance testing. The invention minimizes the charge build up that is inherent when separating the two sheets of insulating film. The invention uses a process entailing the injection of a stream of ionized air from ports on the storage carrier to a designated area between the two insulating sheets before separation. Thus, the triboelectric potential build up is neutralized as it develops.

In general, the invention comprises a mounting structure having at least one port, two sheets of insulating film and a stream of ionized air. The two sheets are connected to the mounting structure. The ports provide direction and passage for the ionized air flow. Semiconductor objects are mounted between the two sheets of insulating film for storage and protection against particulate and handling damage.

Removal of the semiconductor objects from the insulating sheets is achieved by pulling back the top sheet, which results in high instances of triboelectric charge. Elimination of the resulting triboelectric charge and the electrostatic potential built up during storage is effected by directing a stream of ionized air between the insulating sheets before the top sheet is peeled back. The flow of ionized air is continuously applied between the insulating sheets while the top sheet is being removed. The injection of the ionized air between the sheets eliminates the triboelectric and electrostatic charge build-up thus preventing ESD damage to the semiconductor objects.

Figure 1:
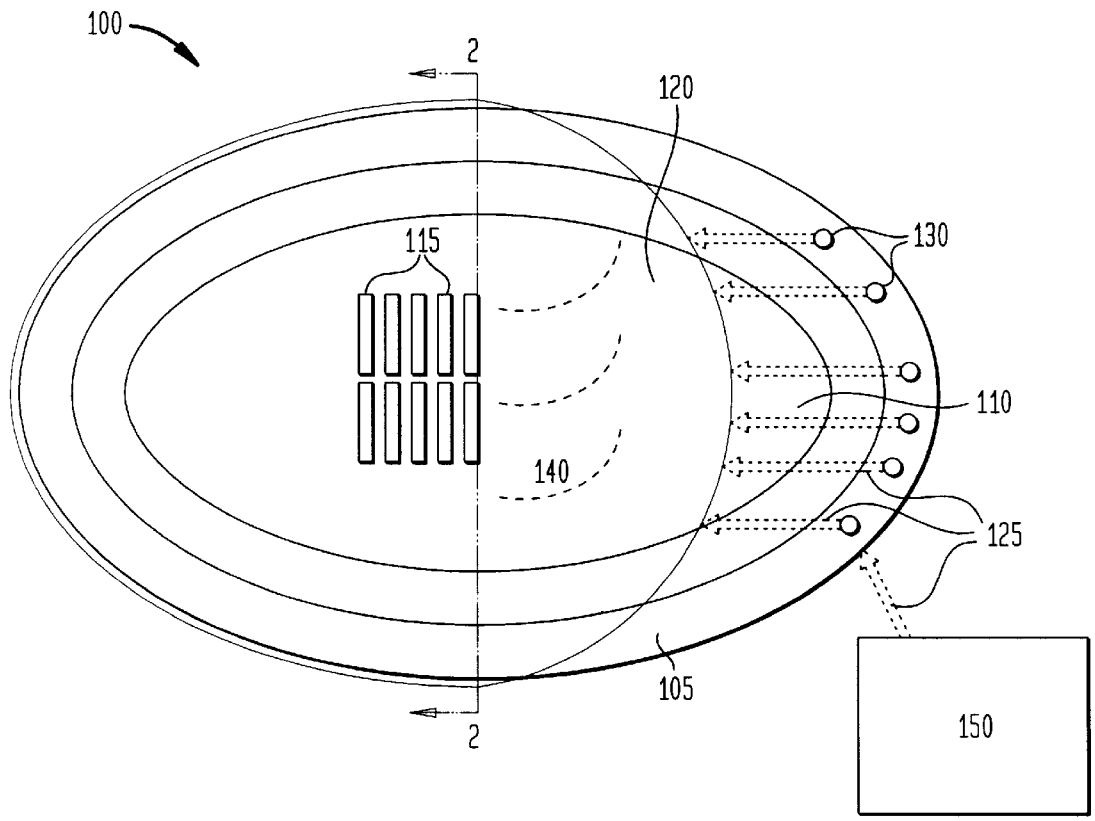
FIG. 1 is an isometric view of an apparatus for minimizing electrostatic discharge damage to semiconductor objects.

Referring now to FIG. 1 an exemplary embodiment of the invention is shown. FIG. 1 depicts an apparatus 100 for reducing electrostatic discharge damage potential. The apparatus 100 has a mounting structure 105. A first insulating sheet 110 is attached to the mounting structure 105. Semiconductor objects 115 are mounted on the first insulating sheet 110. The semiconductor objects 115 are then covered by a second insulating sheet 120 for protection from handling and particulate damage during storage. A preferred embodiment of the storage device is described in co-pending U.S. patent application Ser. No. 09/135,420 entitled "Apparatus and Method for Storing Semiconductor Objects," having common inventors and a common assignee, herein incorporated by reference. Relevant portions of the disclosure of that exemplary storage device from the cross-referenced companion application are reproduced below in the section designated: Description of application Ser. No. 09/135,420 Storage Device.

In the exemplary embodiment, the mounting structure 105 further defines a plurality of ports 130 for directing an ionized air stream 125 into a designated area 135 (FIG. 2) located between the first insulating sheet 110 and the second insulating sheet 120.

Figure 2:
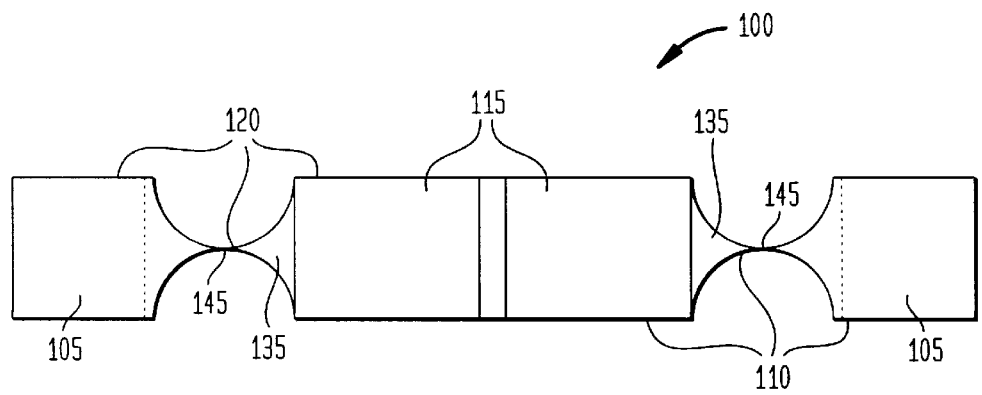
FIG. 2 is a cross sectional view of an apparatus for minimizing electrostatic discharge to semiconductor objects, taken at line 2—2.

FIG. 2 shows a cross sectional view of the apparatus 100 taken along line 2—2 (FIG. 1). FIG. 2 further shows the designated area 135 into which the ionized air stream 125 is aimed. The first insulating sheet 110 adheres to the second insulating sheet 120 at points 145.

Operationally, semiconductor objects 115 are processed and stored in mounting structure 105. The semiconductor objects 115 are placed on the first insulating sheet 110. The second insulating sheet 120 covers the semiconductor objects 115 and adheres to part of the first insulating sheet 110 at points 145. Stored in this way, the semiconductor objects 115 are protected from particulate and handling damage. During storage, electrostatic potential builds within the apparatus 110. This electrostatic potential will discharge when another object comes into contact with the area where the charge is building.

When it is time to remove the semiconductor objects 115 from the apparatus 100, the second insulating sheet 120 must be pulled back (as shown by the curved lines 140) to access the semiconductor objects 115. Operationally, the ionized air stream 125 is directed from an external source (150) to a designated area 135 located between the first insulating sheet 110 and the second insulating sheet 120, while the second insulating sheet 120 is still partially covering the semiconductor objects 115. The ionized air stream 125 eliminates the electrostatic potential that may exist within the first insulating sheet 110 and the second insulating sheet 120. The ionized air stream 125 is continuously applied as the second insulating sheet 120 is pulled back. While the second insulating sheet 120 is being removed, a great instance of triboelectric potential is present. The continuous flow of the ionized air stream 125 eliminates the threat of triboelectric discharge, thereby reducing damage to the semiconductor objects.

Description of application Ser. No. 09/135,420 Storage Device

The invention of the cross-referenced application Ser. No. 09/135,420 is directed to a storage container and a method for storing semiconductor objects in a safe and efficient manner. The container holds a plurality of semiconductor objects of various sizes, such as wafers, wafer sections, bars, lasers and chips. That is, different container structures of the invention are not necessary to store different sized semiconductor objects. The container of the invention stores the semiconductor objects with minimal threat of breakage. Semiconductor objects can be safely stored by the invention for a year or more and are easily and readily removable from the device. The invention uses a mounting structure and a cover to store the objects.

The size of the mounting structure determines the amount and size of semiconductor objects a single storage container can store. It is most efficient to store a plurality of semiconductor objects on the device in an essentially parallel configuration. This allows for easy placement of a label which is especially helpful in identifying the semiconductor objects after being stored for an extended period of time. The label can identify the type of semiconductor object stored, the date of storage and other pertinent information.

Semiconductor objects are placed on a mounting structure comprising an inner frame, an adherent film, and an outer stretching frame. In a preferred embodiment of the invention, the inner frame and outer stretching frame are ring-shaped and the adherent film is a temperature sensitive adherent vinyl as disclosed in U.S. Pat. No. 5,899,730, entitled "Method of Handling Semiconductor wafers, Bars and Chips", having common assignee and herein incorporated by reference. By heating the temperature sensitive adherent vinyl to a certain range of temperatures, the adhesion level of the film is varied. For the adherent film described for the preferred embodiment, the vinyl will be heated to approximately 170° F. for the appropriate level of adhesion and then the semiconductor objects will be attached. The semiconductor objects are attached to the temperature sensitive adherent vinyl in a designated area, preferably the center area of the mounting structure.

The invention further comprises a cover. In a preferred embodiment of the invention, the cover comprises a spacer made of non-stick material and a mylar cover sheet. The spacer can be any thin film of material that has non-stick properties such as a paper mask. The spacer has a cutout corresponding to the designated area of the temperature sensitive adherent film, a perimeter equal to the inner perimeter of the inner frame and at least a thickness of a semiconductor object. After semiconductor objects are placed in the designated area, the spacer is placed on top, contacting the adherent film within the inner perimeter of the inner frame. The placement of the spacer leaves a portion of the adherent film around the inner stretching frame exposed. Finally, the mylar cover sheet is placed over the mounting structure, the semiconductor objects and the spacer, and adheres to the exposed portion of the adherent film. The mylar cover sheet securely protects the semiconductor objects from particulate and handling damage without touching the semiconductor objects.

Referring now to FIGS. 3–8, an exemplary embodiment of the storage device invention and its components are illustrated. Although the description of the device is given where the structural embodiment of the frames of the mounting structure are ring-shaped, the mounting structure can be a variety of other shapes.

Figure 3:
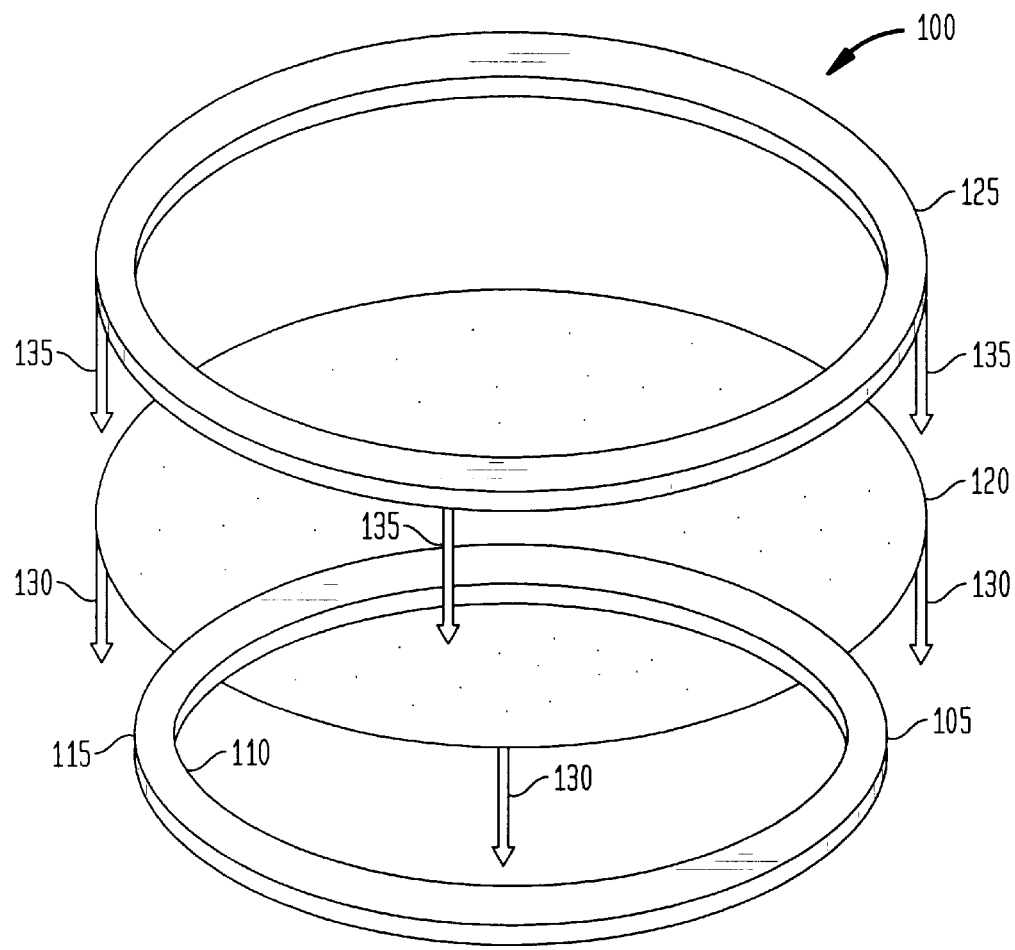
FIG. 3 is a copy of FIG. 1 from companion cross-referenced application Ser. No. 09/135,420, provided to illustrate the storage device of that application.
Figure 4:
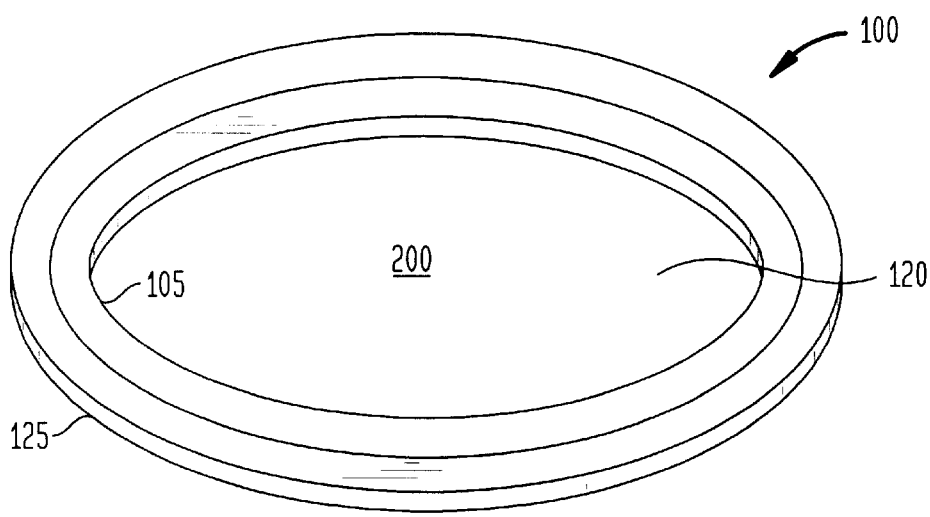
FIG. 4 is a copy of FIG. 2 from companion cross-referenced application Ser. No. 09/135,420, provided to illustrate the storage device of that application.

FIG. 3 illustrates the assembly of a mounting structure 100 having an inner ring 105, outer stretching ring 125 and an adherent film 120. The inner ring 105 has an inner circumference 110 and an outer circumference 115. The adherent film 120, preferably a temperature sensitive adherent film, is circular in shape and has a circumference larger than the outer circumference 115. The outer stretching ring 125 fits around the inner ring 105 in a press fit. The adherent film 120 is draped over the inner ring 105 as shown by arrow 130. The outer stretching ring 125 is then placed over the adherent film 120 and the inner ring 105 as shown by arrow 135. The outer stretching ring 125 stretches the adherent film 120 taut over the inner ring 105 as shown in FIG. 4. FIG. 4 depicts the mounting structure 100 in its fully assembled form. The adherent film 120 is taut and stretched evenly in all directions because the mounting structure 100 is circular in shape. The mounting structure 100 defines a designated area 200 on the adherent film 120 for the placement of semiconductor objects 300 as shown in FIG. 5.

Figure 5:
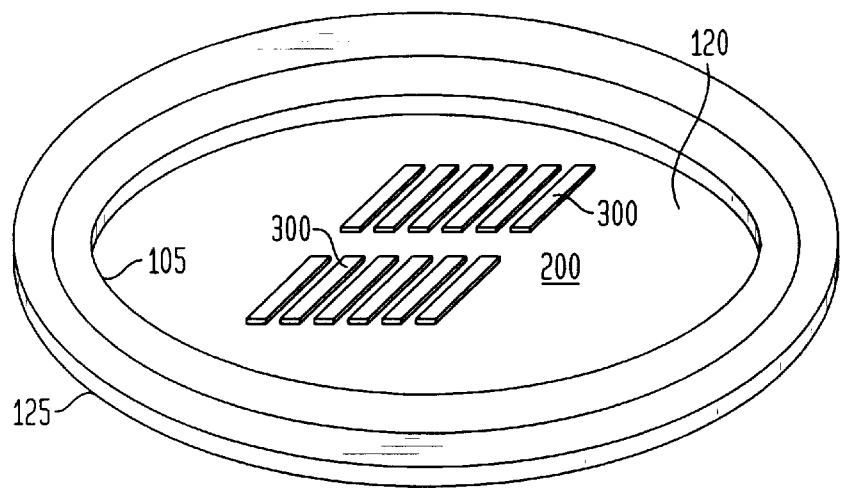
FIG. 5 is a copy of FIG. 3 from companion cross-referenced application Ser. No. 09/135,420, provided to illustrate the storage device of that application.
Figure 6:
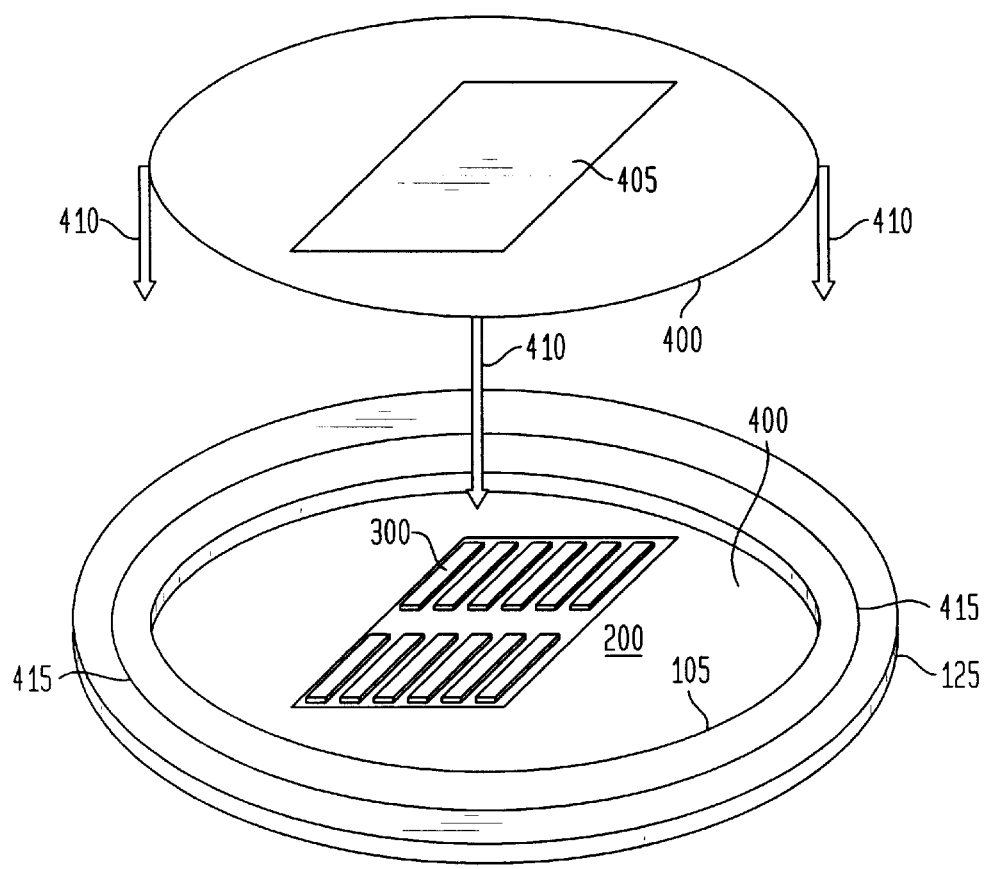
FIG. 6 is a copy of FIG. 4 from companion cross-referenced application Ser. No. 09/135,420, provided to illustrate the storage device of that application.

Referring now to FIGS. 5 and 6, the mounting structure 100 is shown with semiconductor objects 300 loaded. The loaded semiconductor objects 300 have been processed and in cases where the semiconductor objects 300 are not immediately implemented into an electronic or computer device, the semiconductor objects 300 need to be securely and safely stored.

The semiconductor objects 300 adhere to the designated area 200 of the mounting structure 100. The semiconductor objects 300 are placed in an essentially parallel configuration on the mounting structure 100. FIG. 6 further illustrates a spacer 400, preferably a paper mask or other non-stick material. The spacer 400 defines a cutout 405 which corresponds to the designated area 200 of the mounting structure 100 and has a thickness of at least a semiconductor object 300. The spacer 400 is placed on the adherent film 120 as shown by arrow 410. The positioning of the spacer 400 creates an exposed portion 415 of the adherent film 120 around the inner ring 105.

Figure 7:
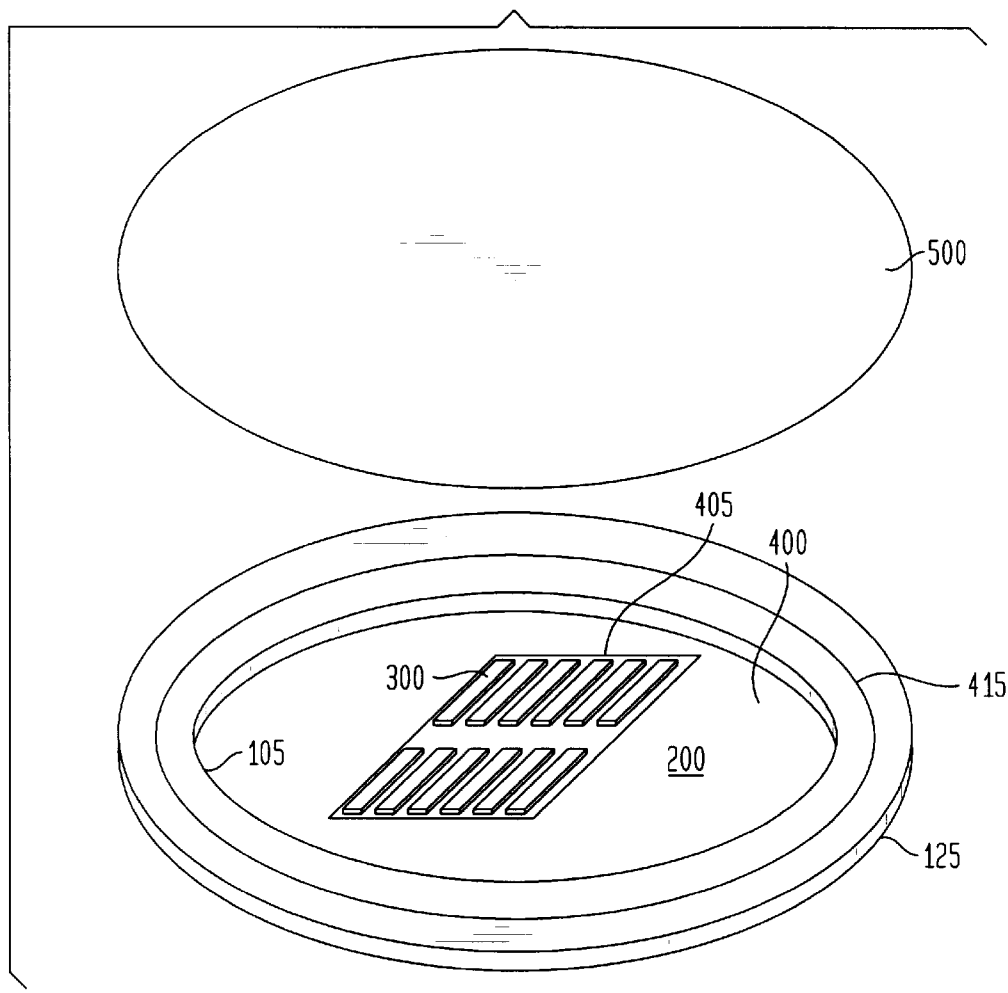
FIG. 7 is a copy of FIG. 5 from companion cross-referenced application Ser. No. 09/135,420, provided to illustrate the storage device of that application.

FIG. 7 shows a mylar cover sheet 500. The mylar cover sheet 500 is circular in shape and must be at least the size of the outer stretching ring 125. The mylar cover sheet 500 protects the semiconductor objects 300 from particulate and handling damage.

Figure 8:
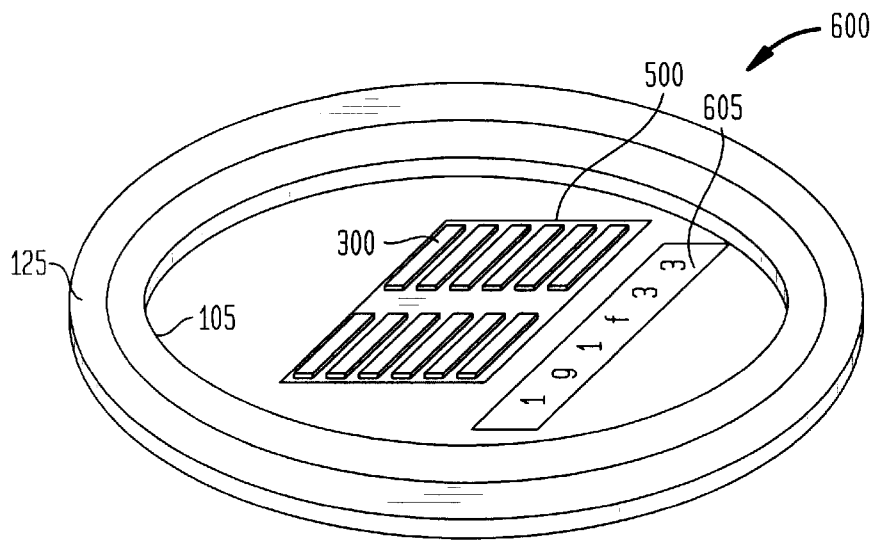
FIG. 8 is a copy of FIG. 6 from companion cross-referenced application Ser. No. 09/135,420, provided to illustrate the storage device of that application.

FIG. 8 shows a carrier 600 for storing semiconductor objects 300 fully loaded with semiconductor objects, covered and ready for storage. A label 605 is shown to clearly identify the kind of semiconductor objects 300 being stored by the device 600.

Operationally, the adherent film 120 of the mounting structure 100 as shown in FIG. 4 is heated to the appropriate temperature to attain desired level of adhesion. The semiconductor objects 300 are placed on the designated area 200 of the adherent film 120 and securely adhere to the adherent film 120 as shown FIG. 5. The spacer 400 is placed on a portion of the adherent film 120 located within the inner circumference 110 as shown by arrows 410 (FIG. 6). The cutout 410 corresponds with the designated area 200 so that the semiconductor objects 300 are not covered by the spacer 400. The spacer 400 prevents the mylar cover sheet 500 from touching the semiconductor objects 300.

Referring now to FIG. 7, the mylar cover sheet 500 is applied over the semiconductor objects 300 and the spacer 400. The mylar cover sheet 500 will adhere to the exposed portion 415 of the adherent film 120. More importantly, the mylar cover sheet 500 will not touch the semiconductor objects 300 because of the spacer 400. The mylar cover sheet 500 ensures that the semiconductor objects 300 remain positioned on the adherent film 120 without contacting and causing damage to the semiconductor objects 300. Furthermore, the mylar cover sheet 500 protects the semiconductor objects 300 from particulate and handling damage. A label 605 can then be placed directly on the mylar cover sheet 500. The label 605 allows for quick and easy removal of the correct semiconductor object 300.

While the invention has been described with reference to preferred embodiments, it should be appreciated by those skilled in the art that the invention may be practiced otherwise than as specifically described herein without departing from the scope of the invention. In particular, while the storage containers on which the invention operates has been described in terms of a packaging of the semiconductors between two insulating films, the invention may also be applied for a variety of other storage containers, including protective envelopes. It is, therefore to be understood that the scope of the invention be limited only by the appended claims.

What is claimed:

1. An apparatus for minimizing triboelectric discharge damage to semiconductor objects upon removal of said objects from a storage container comprising:

an ionized air stream source;

a mounting structure for mounting said storage container and having at least one port for accommodating an ionized air stream, said at least one port being disposed in said mounting structure such as to cause a stream of ionized air flowing therethrough to be directed toward an aperture in said storage container, said aperture being arranged to accommodate removal of said objects from said storage container;

wherein said storage container comprises:

a first sheet of insulating film, said first sheet being attached to said mounting structure, and said semiconductor objects being mounted on said first sheet of insulating film; and a second sheet of insulating film overlaying said first sheet of insulating film to form a storage area therebetween for storage of said semiconductor objects, wherein each edge of said second sheet but one is sealed to a corresponding edge of said first sheet and the non-sealed edge of said first and said second sheet defines said storage container aperture, and further wherein said storage container is opened for removal of said semiconductor objects by causing said second sheet of insulating film to be pulled back from said aperture edge in the presence of a continuous stream of ionized air being directed from said at least one port toward said storage container aperture.

2. A method for minimizing triboelectric discharge damage of semiconductor objects during removal of said objects from a storage container, wherein said storage container is formed by joining a first insulating sheet and an overlaid second insulating sheet to form an enclosure having an aperture, said aperture being arranged to accommodate removal of said objects from said storage container said method comprising the steps of:

disposing said storage container in a mounting structure having a source of ionized air and a port arranged therein for directing a stream of said ionized air toward said storage container aperture;

directing said ionized air stream continually toward said aperture of said storage container;

causing said second sheet of insulating film to be peeled back from said aperture in the presence of said continuous stream of ionized air being directed toward said storage container aperture to facilitate removal of said semiconductor objects from said storage container; and upon said second sheet being peeled back a sufficient amount to permit removal of said semiconductor objects, removing said semiconductor objects while in the continuing presence of said ionized air stream.

* * * * *